United States Patent
Gardner et al.

[11] Patent Number: 5,929,496
[45] Date of Patent: Jul. 27, 1999

[54] METHOD AND STRUCTURE FOR CHANNEL LENGTH REDUCTION IN INSULATED GATE FIELD EFFECT TRANSISTORS

[76] Inventors: Mark I. Gardner, P.O. Box 249, Hwy. 535, Cedar Creek, Tex. 78612; Thomas E. Spikes, Jr., 2426 Roundabout La., Round Rock, Tex. 78664; Robert Paiz, 3104 Jeanette Ct., Austin, Tex. 78745

[21] Appl. No.: 08/993,767

[22] Filed: Dec. 18, 1997

[51] Int. Cl.[6] .................. H01L 29/76; H01L 29/94; H01L 31/062; H01L 31/113
[52] U.S. Cl. .................................. 257/401; 257/346
[58] Field of Search ....................... 257/401, 346

[56] References Cited

U.S. PATENT DOCUMENTS

| | | |
|---|---|---|
| 4,149,904 | 4/1979 | Jones . |
| 4,682,404 | 7/1987 | Miller et al. . |
| 5,146,291 | 9/1992 | Watabe et al. . |
| 5,427,971 | 6/1995 | Lee et al. . |
| 5,614,739 | 3/1997 | Abrokwah et al. . |
| 5,623,153 | 4/1997 | Liang et al. . |

Primary Examiner—Stephen D. Meier

[57] ABSTRACT

A method and structure are provided for an IGFET which has a highly scalable short conduction channel length. The short channel IGFET functions more rapidly than do longer conduction channel devices. Lightly doped regions provide a graded extension or buffer region to the conduction channel. Thus, the voltage drop is shared by the source/drain and channel, in contrast to an abrupt n+/p junction where the almost the entire voltage drop occurs across the lightly doped (channel) side of the junction. This method and structure preserves the integrity of the IGFET by protecting the gate from "hot electron injection." The method and structure provide an IGFET with increased performance without compromising the IGFET's reliability or longevity.

9 Claims, 4 Drawing Sheets

METHOD AND STRUCTURE FOR CHANNEL LENGTH REDUCTION IN INSULATED GATE FIELD EFFECT TRANSISTORS

RELATED APPLICATIONS

This application is related to the co-filed and commonly assigned application entitled "Method and Structure for High Aspect Gate and Short Channel Length Insulated Gate Field Effect Transistors," which is hereby incorporated by reference.

FIELD OF THE INVENTION

The present invention relates generally to semiconductor integrated circuits. More particularly, it pertains to a method and structure for channel length reduction in insulated gate field effect transistors.

BACKGROUND OF THE INVENTION

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a insulating layer such as a gate oxide. The operation of the IGFET involves application of an input voltage to the gate, which sets up a transverse electric field in the channel in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide a gate which provides a mask during formation of the source and drain by ion implantation. Thereafter, a drive-in step is applied to repair crystalline damage and to drive-in and activate the implanted dopant.

There is a desire to reduce the dimensions of the IGFET. The impetus for device reduction comes from two directions. One is the desire to increase the number of individual IGFETs that can be placed onto a single silicon chip or die. More IGFETs on a single chip leads to increased functionality. A second desire is to improve performance, and particularly the speed, of the IGFET transistors. Increased speed allows for a greater number of operations to be performed in less time. IGFETs are used in great quantity in computers where the push to obtain higher operation cycle speeds demands faster IGFET performance.

One method to increase the speed of an IGFET is to reduce the length of the conduction channel underneath the gate and gate oxide regions. However, as IGFET dimensions are reduced and the supply voltage remains constant (e.g., 3 V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

As shown above, a threshold point exist where heightened speed and reduced dimensions will lead to IGFET breakdown. Conventional approaches have encountered difficulty trying to reconcile the methods for decreasing the hot carrier effects and the methods for improving performance. Also, it is desirable to achieve these sought after results without adding costly processing steps. Thus, it is an objective to uncover newly configured IGFET structures and the methods to produce the same which will increase performance and not compromise the EGFET's longevity or fabrication costs.

SUMMARY OF THE INVENTION

A method for forming a device which has a highly scalable conduction channel length is provided. The method of fabrication includes forming a gate oxide on the surface of a substrate. A gate is formed on the surface of the gate oxide. The length of the gate oxide underneath a portion of the gate is reduced while maintaining the original size of the gate. Source and drain regions are then implanted into the substrate. The method includes forming a lightly doped regions underneath the portion of the gate wherein the gate oxide was removed.

In one embodiment, the length of the gate oxide is reduced by performing a buffered oxide etch to remove the gate oxide from underneath a portion of the gate adjacent to the source and drain regions. The buffered oxide etch does not attack the gate material. In an alternative embodiment, the etching is performed using a hydroflouric acid etch (HF). In still another embodiment, the etching process is a plasma etch.

A device is provided which has a highly scalable conduction channel length. The device includes a semiconductor substrate with a gate oxide on the surface of the substrate. There is gate provided on the surface of the gate oxide. In the device, a portion of the gate is greater in length than the gate oxide and extends past the gate oxide underneath. The device includes a source region on the substrate and a drain region on the substrate. The source and drain regions are self-aligned to the gate. Lightly doped regions are provided on the substrate and underneath the portions of the gate which is longer in length than the gate oxide.

An information handling system is also provided which includes the above device. The system has a central processing unit, a random access memory; and a system bus for coupling the central processing unit to the random access memory. As stated, the system includes the above device along with each of its features. Those features include the semiconductor substrate, gate oxide on the surface of the substrate and a gate on the surface of the gate oxide. The gate is greater in length than the gate oxide and extends past the gate oxide underneath. A source and drain region are included on the substrate.

Thus an improved performance IGFET is provided which increases the performance, and particularly operation speed, of the IGFET device while maintaining device longevity. The fabrication of the IGFET can be performed without significantly increasing costly fabrication steps. The invention capitalizes on the use of a lightly doped source and drain junction and a short conduction channel.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

The following detailed description of the preferred embodiments can best be understood when read in conjunction with the following drawings, in which.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Method of Fabrication

FIGS. 1A–1F, describe generally various processing techniques of one embodiment of an IGFET which has a highly scalable conduction channel length.

Figure 1A:
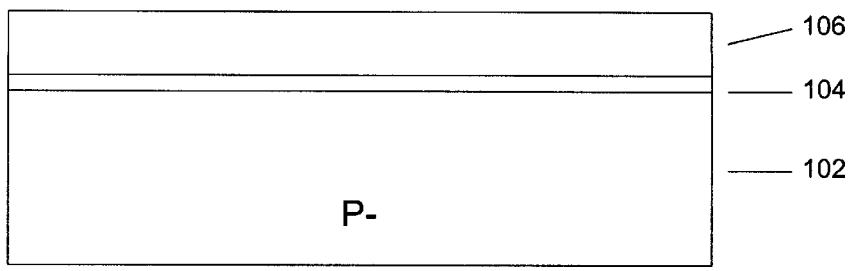
FIGS. 1A–1F show cross-sectional views of successive process steps for making an IGFET with a highly scalable conduction channel length in accordance with an embodiment of the invention.

In FIG. 1A, illustrates the structure after the following sequence of process steps. A substrate 102 is provide wherein the upper surface of the substrate 102 is an epitaxial layer suitable for integrated circuit manufacture. In one embodiment the substrate 102 is a P-type substrate with a boron background concentration on the order of $1 \times 10^{16}$ atoms/cm$^3$, a <100> orientation and a resistivity of 12 ohm-cm. Preferably, the epitaxial surface layer of the substrate 102 is disposed on a P+base layer (not shown) and includes a planar top surface. In an alternative embodiment, the substrate 102 is an N-type substrate on an N+base layer.

A gate oxide 104 is formed on the top surface of the substrate 102. The gate oxide can be formed through any suitable process, such as by chemical vapor deposition (CVD). In an alternative embodiment, the gate oxide is thermally grown on the substrate 102. Next, a blanket layer of undoped polysilicon 106 is deposited on the top surface of gate oxide 104. The polysilicon 106 is a suitable gate material and can be deposited by any suitable method, such as by CVD. The upper surface of the structure now shown in FIG. 1A is chemically mechanically polished/planarized (CMP).

Figure 1B:
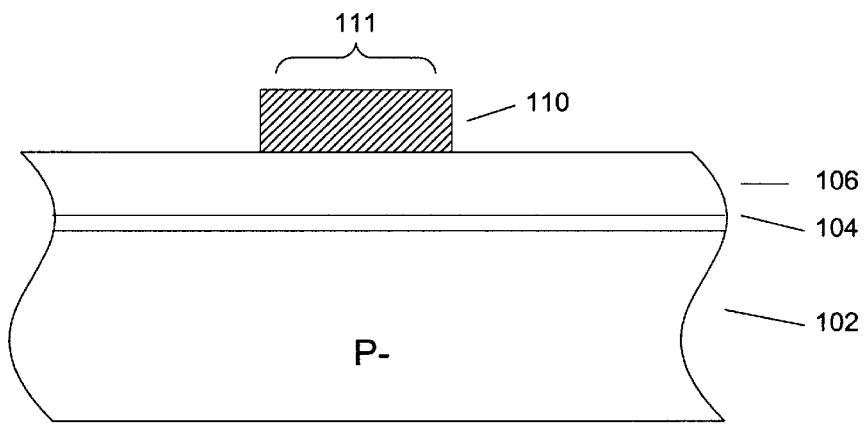

In FIG. 1B, photoresist 110 is deposited as a continuous layer on polysilicon 106 and selectively irradiated using a photolithographic system, such as a step and repeat optical projection system, in which I-line ultraviolet light from a mercury-vapor lamp is projected through a first reticle and a focusing lens to obtain a first image pattern. Thereafter, the photoresist 110 is developed and the irradiated portions of the photoresist are removed to provide openings in photoresist 110. The openings expose portions of polysilicon 106, thereby defining a gate region 111.

Figure 1C:
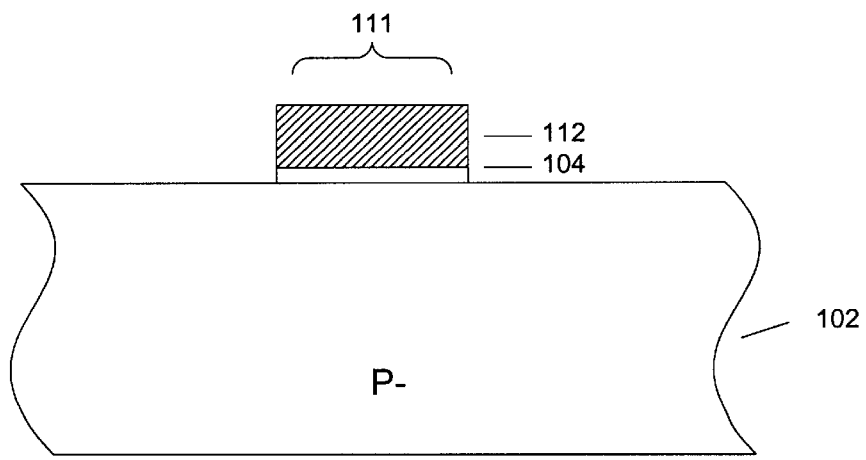

In FIG. 1C, an anisotropic etch is applied that removes the exposed portions of polysilicon 106. Various etchants can be used to anisotropically etch or to selectively remove the polysilicon and oxide layers. Preferably, a first dry or plasma etch is applied that is highly selective of polysilicon. Most of the polysilicon layer 106 is removed, except for the portion beneath the remaining photoresist 110. The gate oxide 104 is similarly removed. After the etching step or steps, the gate region 111 remains. The gate region has opposing sides, 114 and 116 respectively. The gate region includes; the polysilicon layer 106 on top of the gate oxide 104 on top of the substrate 102. The polysilicon layer 106 serves as a gate 112 and includes opposing vertical sidewalls 114 and 116. The photoresist 110 is stripped, using conventional photoresist stripping techniques. The structure is now as appears in FIG. 1C.

Figure 1D:
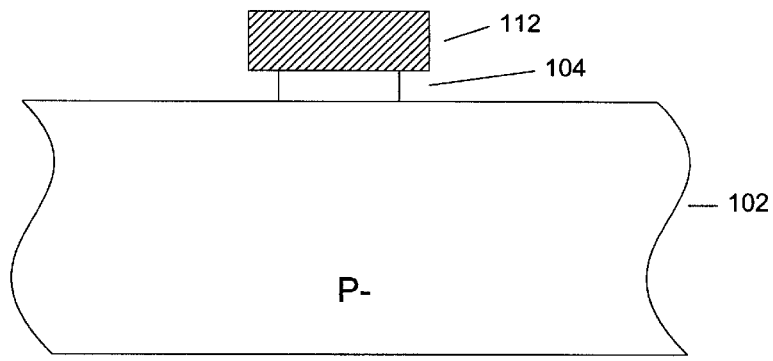

In FIG. 1D, the exposed edge of the gate oxide 104 found on the opposing sides, 114 and 116 respectively, are etched back. The etching is performed in one step thus reducing the need for excess processing steps. The etching is performed by a buffered oxide etch (BOE) by which rate of etching can be controlled to provide highly scable gate oxide 104 lengths. In an alternative embodiment the etching may be performed either through a hydroflouric acid etch (HF) or through the use of a plasma etch. In this process, the length of the gate oxide is scalably reduced to minimum length of 0.3 micrometers ($\mu$m), and more typically to length between 0.5 and 1.5 $\mu$m. The structure is now as illustrated by FIG. 1D.

Figure 1E:
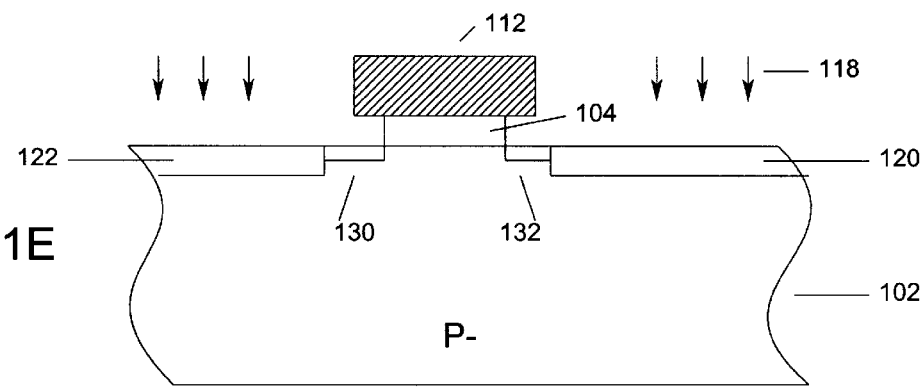

FIG. 1E illustrates the structure following the next set of process steps. A source region 120 and a drain region 122 are provided by implanting ion dopants into the top of the substrate 102. The ion implantation uses conventional ion implanting techniques and the direction of implantation is indicated by arrows 118. In one embodiment, the source and drain regions, 120 and 122 respectively, comprise the n+silicon material, phosphorous. The gate behaves as an implant mask and provides for self-aligned source and drain regions, 120 and 122 respectively. Next, a high temperature rapid thermal anneal (RTA) is conducted in the presence of Arsenic (As) gas. As those skilled in the art will appreciate, this process cures out the crystal damage induced by the previous ion implant process. Additionally, the annealing step is performed in the presence of As gas. The presence of the As gas causes an additional doping implantation into the substrate. Lightly doped regions, 130 and 132 respectively, are formed in the substrate 102, beneath the gate 112, in the region where the gate oxide 104 has been etched back. The lightly doped regions disposed adjacent to the source and drain regions 120 and 122 respectively. Processing steps are maintained at a minimum by forming the lightly doped regions, 130 and 132 respectively, in the same step. The structure is now as shown in FIG. 1E.

Figure 1F:
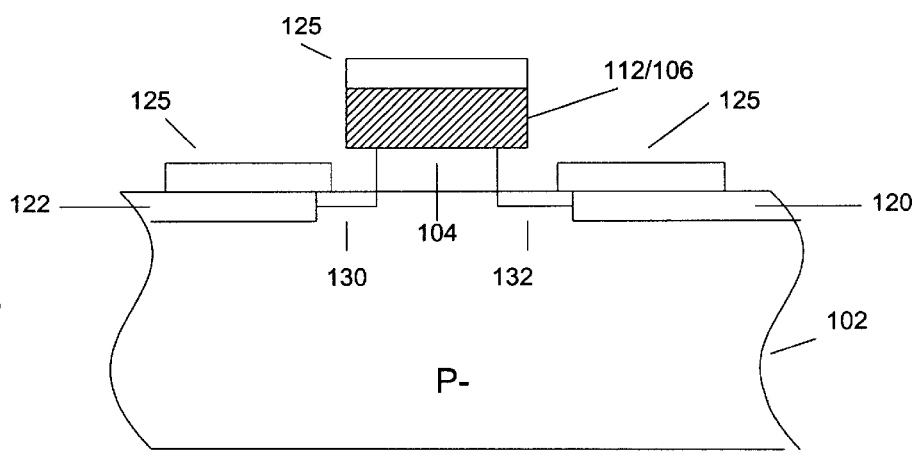

FIG. 1F illustrates the structure after the final sequence of process steps. salicide contacts 125 are formed on the gate 112, source 120, drain 122 and lightly doped region 114. Additionally contact formation, not included here, is achieved using conventional techniques. These further processing steps are not repeated herein. Likewise, the principal processing steps disclosed herein may be combined with other steps apparent to those skilled in the art.

Figure 2:
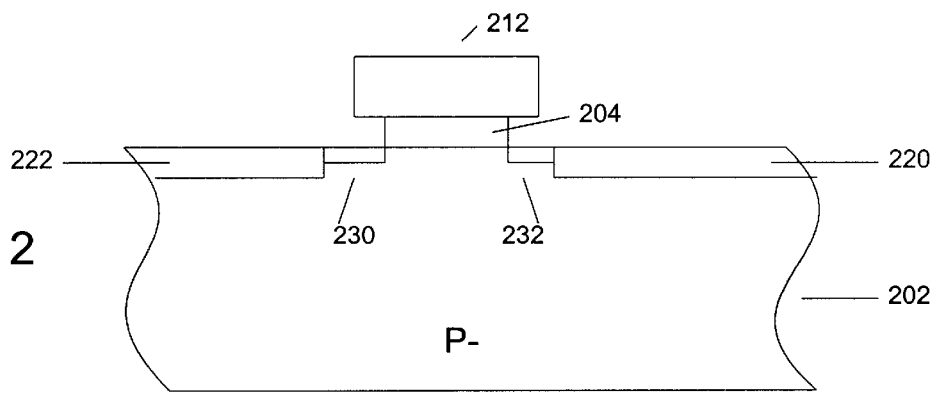
FIG. 2 illustrates the completed IGFET structure in accordance with an embodiment of the invention.

The present invention includes numerous variations to the embodiment described above. For instance, the completed device illustrated in FIG. 2 is one embodiment of the invention. FIG. 2 is a cross sectional view wherein a gate 212 is formed on a gate oxide 204. The gate 212 has opposing sides 214 and 216 respectively. The length of the gate is longer on both opposing sides 214 and 216 respectively, than the gate oxide 204 located beneath. The length of the gate 212 is longer than the length of the dielectric 204 due to the application of an etchant which etched back the gate oxide 204 from beneath opposing sides 214 and 216 respectively. A source region 220 and a drain region 222 are provided in a manner that is self aligned with the gate 212. Lightly doped regions, 230 and 232 respectively, are provided on the substrate 202, beneath the gate 212, in the region where the gate oxide 204 was etched back. A salicide layer 225 is provided which couples to the source 220, drain 222, lightly doped regions 230 and 232, and gate 212 regions.

The lightly doped regions reduce hot carrier effects by reducing the maximum lateral electric field. Including a heavily doped portion and a lightly doped portion in a source or drain is referred to as having graded doping within the source and drain. Lightly doping both the source and drain regions allows for bi-directional operation and requires only a single process step. IGFETs without graded doping generally have a shortened life which is well below the industry-wide design point of a 10-year life. To extend the life of an IGFET, a drain with a graded, or lightly doped extension is produced. Qualitatively, $\epsilon_{ymax}$ (maximum channel electric field) is reduced by such a graded or lightly doped extension or buffer region because the maximum electric field in a reverse-biased pn junction is highest when the junction is abrupt. By replacing the abrupt source and drain doping profiles of a conventional IGFET with a source and drain that has a more gradually decreasing lateral doping profile (i.e., a graded drain), the voltage drop becomes shared by the drain and the channel, in contrast to an abrupt n+/p drain junction, in which almost the entire voltage drop occurs across the lightly doped (channel) side of the junction. The model equation for $\epsilon_{ymax}$ is provided below:

$$\epsilon_{ymax}=(V_{DS}-V_{DSsat})/l \qquad \text{(Equation 1)}$$

where, $\epsilon_{ymax}$ is the maximum channel electric field, l is the channel length, $V_{DS}$ is the voltage across the channel, and $V_{DSsat}$ is the voltage across the channel at saturation. $\epsilon_{ymax}$ is significantly reduced by the presence of such a lightly doped region because this is another way to increase the denominator of Equation 1.

Thus the invention provides a method and structure for an IGFET which has a shorter conduction channel in the range of 0.5 to 1.5 μm. The conduction channel is highly scalable. This fact allows the IGFET to function more rapidly than do longer conduction channel devices. Lightly doped source and drain regions similarly preserves the integrity of the IGFET by protecting the gate from "hot electron injection."

Figure 3:
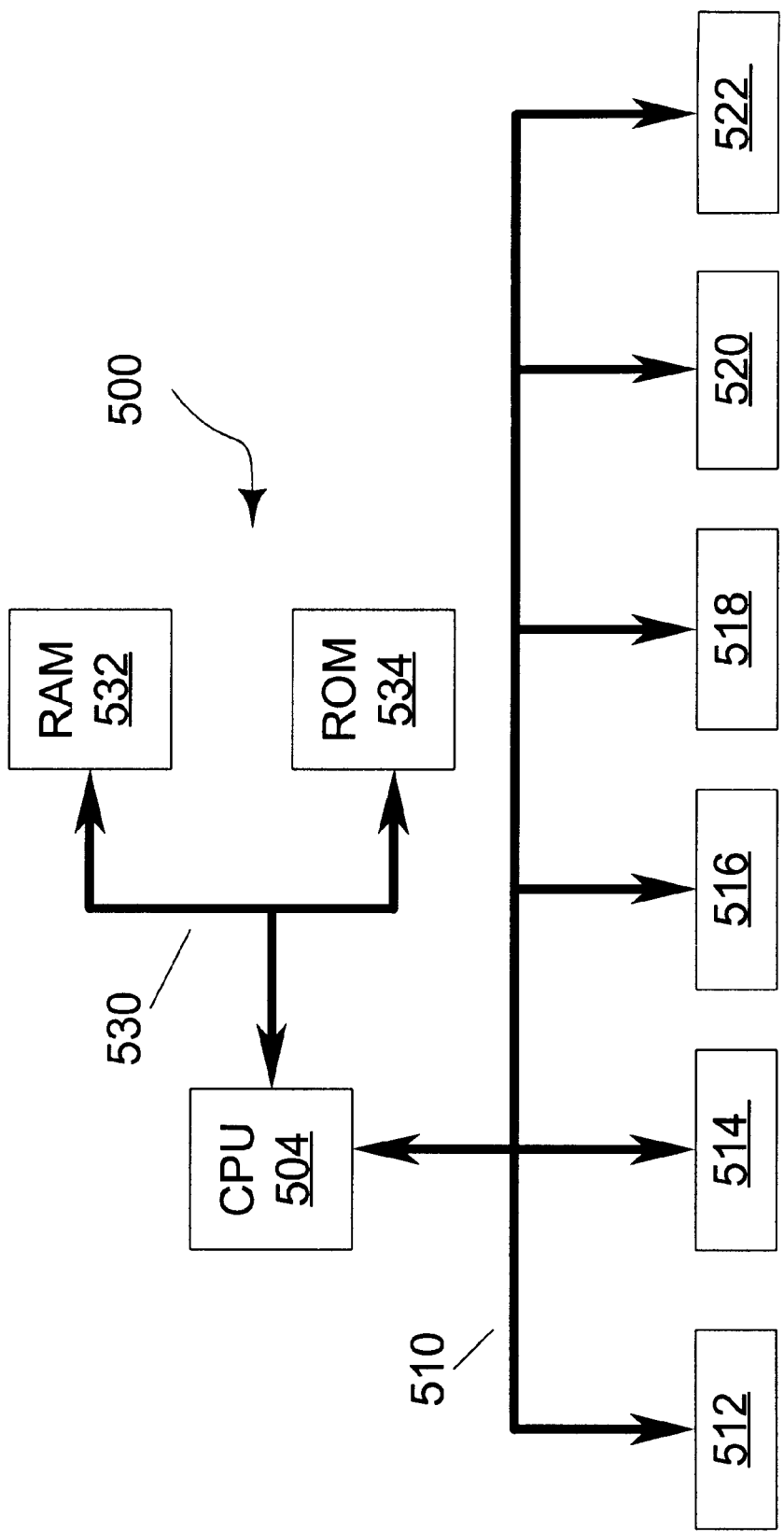
FIG. 3 is a block diagram of an information handling system.

Advantageously, the invention is well-suited for use in a device such as an integrated circuit chip, as well as an electronic system including a microprocessor, a memory and a system bus. The electronic system may also be an information handling system 500 as shown in FIG. 3. The information handling system includes a central processing unit 504, a random access memory (RAM) 532, a read only memory (ROM) 534, and a system bus 530 for communicatively coupling the central processing unit 504 and the RAM 532 and the ROM 534. The system 500 also includes an input/output bus 510 and several devices peripheral devices, such as 512, 514, 516, 518, 520, and 522. The device peripherals attach to the input output bus 510. Peripheral devices include hard disk drives, floppy disk drives, monitors, keyboards and other such peripherals. The information handling system 500 includes a device such as is shown in FIG. 2. The graded doping regions in the device provide for a fast and reliable channel having a long life. Faster channels are needed as clocking speeds for microprocessors climb and the channel must also be reliable and long-lived.

Although specific embodiments have been illustrated and described herein, it is appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the claims and the equivalents thereof.

What is claimed is:

1. A device comprising:
   a singular layer of gate oxide on a surface of a semiconductor substrate;
   a gate on a surface of the singular layer of gate oxide, the gate having opposing sides, wherein the gate is greater in length than the singular layer of gate oxide and extends past the singular layer of gate oxide on both of the opposing sides;
   a source region within the substrate;
   a drain region within the substrate; and
   lightly doped regions extending respectively from the source and drain regions and located underneath the portions of the gate where oxide is absent.

2. The device of claim 1 wherein the length difference between the gate and the gate oxide is formed by applying an etchant to the gate oxide underneath the gate.

3. The device of claim 1 wherein the source region and the drain region are self-aligned with the gate.

4. The device of claim 1 wherein the lightly doped regions are formed from Arsenic (As) in the gaseous form.

5. The device of claim 1 further comprising a salicidation layer on the source region, the drain and lightly doped regions, and the gate.

6. An information handling system comprising:
   a central processing unit;
   a random access memory; and
   a system bus for communicatively coupling the central processing unit and the random access memory, said information handling system further including a device further comprising:
   a singular layer of gate oxide on a surface of a semiconductor substrate;
   a gate on a surface of the singular layer of gate oxide, the gate having opposing sides, wherein the gate is greater in length than the gate oxide and extends past the gate oxide on both of the opposing sides;
   a source region within the substrate;
   a drain region within the substrate; and
   lightly doped regions extending respectively from the source and drain regions and located underneath the gate where oxide is absent.

7. The information handling system of claim 6 wherein the length difference between the gate and the gate oxide is formed by applying an etchant to the gate oxide underneath the gate.

8. The information handling system of claim 6 wherein the source region and the drain region are self-aligned with the gate.

9. The information handling system of claim 6 wherein the lightly doped regions are formed from Arsenic (As) in the gaseous form.

* * * * *